United States Patent [19]

Murphy et al.

[11] Patent Number: 5,142,274
[45] Date of Patent: Aug. 25, 1992

[54] SILHOUETTE ILLUMINATED VEHICLE HEAD-UP DISPLAY APPARATUS

[75] Inventors: Morgan D. Murphy, Kokomo; James M. Clem, Macy, both of Ind.

[73] Assignee: Delco Electronics Corporation, Kokomo, Ind.

[21] Appl. No.: 674,258

[22] Filed: Mar. 25, 1991

Related U.S. Application Data

[63] Continuation-in-part of Ser. No. 399,563, Aug. 24, 1989.

[51] Int. Cl.$^5$ ............................................. G09G 3/02
[52] U.S. Cl. ................................... 340/705; 340/767; 340/753; 362/27; 362/23; 362/30; 116/47; 116/48; 116/286
[58] Field of Search .................. 362/23, 27, 29, 30, 362/31; 340/815.06, 815.17, 815.19, 815.26, 716, 781, 767, 753, 705; 116/46, 47, 49, 286, 287, 288

[56] References Cited

U.S. PATENT DOCUMENTS

| | | | |
|---|---|---|---|
| 1,743,401 | 1/1930 | Schlaich | 362/23 |
| 1,823,868 | 9/1931 | Zubaty | 40/443 |
| 2,953,668 | 9/1960 | Bassett, Jr. | 200/167 |
| 3,267,598 | 8/1966 | Olesen et al. | 40/130 |
| 4,044,708 | 8/1977 | Klein | 116/129 P |
| 4,236,480 | 12/1980 | Grohl | 116/286 |
| 4,559,582 | 12/1985 | Scardilli et al. | 362/23 |
| 4,621,306 | 11/1986 | Sell | 362/29 |
| 4,771,368 | 9/1988 | Tsukamoto et al. | 362/29 |
| 4,845,595 | 7/1989 | Fujii et al. | 363/30 |
| 4,959,759 | 9/1990 | Kohler | 362/80 |
| 4,991,064 | 2/1991 | Clem | 362/30 |

FOREIGN PATENT DOCUMENTS

| | | |
|---|---|---|
| 0078372 | 8/1982 | European Pat. Off. |
| 0172686 | 10/1983 | Japan |
| 0711167 | 6/1954 | United Kingdom |
| 1445840 | 11/1972 | United Kingdom |

OTHER PUBLICATIONS

Undated VDO/Yazaki product information brochure "Road & Track", Apr. 1989, pp. 146, 148.

*Primary Examiner*—Alvin E. Oberley
*Assistant Examiner*—Chanh Nguyen
*Attorney, Agent, or Firm*—Anthony Luke Simon

[57] ABSTRACT

An improved vehicle head-up display apparatus in which both the display and pointer of the image source are illuminated for low ambient driver viewing by a back lighting means mounted on the rear face of the display. A generally opaque applique includes a translucent region in registry with the backlit area, and bright opaque graphic symbols painted or deposited onto a surface of the applique wihin the translucent region. A pointer disposed in proximity to the front surface of the applique is provided with juxtaposed bright opaque and transparent regions. In high ambient lighting conditions when the back lighting means is not lit, a front lighting means illuminates the bright opaque graphic symbols and pointer stripes so that a viewer of the projected display perceives an image of the bright opaque graphic symbols and pointer stripes. In low ambient lighting conditions when the back lighting means is lit, the viewer perceives a projection of the opaque graphic symbols and pointer stripes in silhouette against the relatively bright translucent regions of the applique and pointer, respectively.

9 Claims, 3 Drawing Sheets

SILHOUETTE ILLUMINATED VEHICLE HEAD-UP DISPLAY APPARATUS

This application is a continuation-in-part of U.S. patent application Ser. No. 07/399,563, filed Aug. 24, 1989, and assigned to the assignee of this invention.

This invention relates to vehicle instrument head-up displays (HUDs), and more particularly, to a head-up display illumination apparatus which causes the display graphics and pointer to appear in silhouette when the display is illuminated for driver viewing during low ambient lighting conditions.

BACKGROUND OF THE INVENTION

Head-up displays have long been used in airplanes to aid the pilots. The HUD reflects information the pilot needs off of a half mirror or the windshield and projects that information at a distance in front of the plane so that the pilot does not have to look into the cockpit to see the information.

More recently, HUDs have been used in automotive applications in which the image is projected up and reflected off of the vehicle front windshield, to appear at a distance in front of the driver in combination with scenery forward of the vehicle. With a HUD in a vehicle, the driver does not have to adjust his/her eyes from the road to read information, such as vehicle speed, which is normally displayed in the vehicle instrument panel.

In designing head-up displays, designers prefer a broad range of available display colors for increased design flexibility. Experience has shown, however, that certain parts of the visible spectrum are preferable in a daytime head-up display projection because they are more visible with the ambient daylight in the background. During night time projections, there is an increased range of colors that are well suited for head-up display projections.

What is desired is a display source for a head-up display that is non-emissive and that is suitable for use of the maximum preferred light spectrum.

SUMMARY OF THE PRESENT INVENTION

The present invention is directed to an improved vehicle head-up display apparatus in which both the display and pointer are illuminated for low ambient driver viewing by back lighting means through a light pipe mounted on the rear face of the display. As an alternative to the light pipe, an electroluminescent light source may be used. The image source of the apparatus comprises a generally opaque applique having a translucent region in registry with the light transmissive area of the light pipe, and bright opaque graphic symbols painted or deposited onto a surface of the applique within the translucent region. A pointer disposed in proximity to the front surface of the applique is provided with juxtaposed bright opaque and translucent/transparent stripes.

In high ambient light conditions, the back lighting means is not lit and a front lighting means lights, from the front, the bright opaque portions of the display, which dominate. In this case, a viewer of the projected display perceives the bright opaque graphic symbols and pointer stripes against background visual data seen through the vehicle front windshield. In low ambient lighting conditions, the back lighting means is lit, the front lighting means is not lit, and the translucent portions of the display dominate. In this case, the viewer perceives a projection of the opaque graphic symbols and pointer stripes in silhouette against the relatively bright translucent regions of the applique and pointer, respectively. No separate pointer lighting is required since light from the translucent region passes through the translucent/transparent stripe of the pointer.

Thus, the display of the present invention offers increased flexibility to display designers. During high ambient light conditions, the colors of the bright opaque graphics symbols are prominent in the display, and are chosen to project well during high ambient lighting conditions. During low ambient conditions, the silhouette color provided by the light piping is prominent in the projection and can be chosen by the designer from a wide range of colors because of the increased flexibility allowed during low lighting conditions.

DETAILED DESCRIPTION OF THE DRAWINGS

Figure 1:
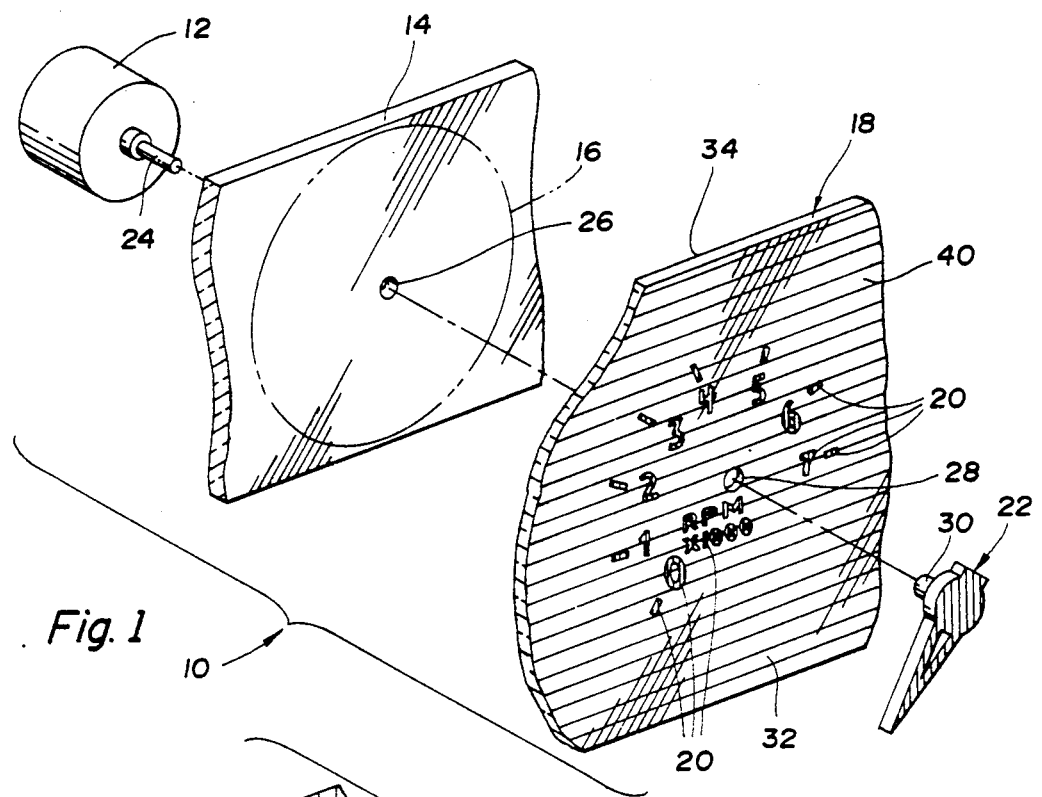
FIG. 1 is an exploded view of an image source for a projected head-up display apparatus according to this invention, including the pointer and driver, the light pipe and the applique.

Referring to FIG. 1, the reference numeral 10 generally designates the elements of an image source for a vehicle head-up display according to this invention. The image source 10 comprises a rotary actuator 12, such as a conventional air core gauge mechanism, a light pipe 14 (also referred to as the light piping means) transmitting light from a back lighting means 60 (FIG. 6) having an active light transmitting region 16, an applique 18 having bright opaque graphic symbols 20 painted or deposited on the surface thereof, and a rotatable pointer 22. As an alternative, light pipe 14 and the back lighting means may be replaced by an electroluminescent lamp, which may also be represented, for the purpose of illustration, by reference numeral 14. The applique 18 is mounted on the light pipe 14 such that the graphic symbols 20 fall within the active region 16. The rotary output shaft 24 of actuator 12 extends through central openings 26 and 28 in light pipe 14 and applique 18 for attachment to the hub 30 of pointer 22.

Figure 2:
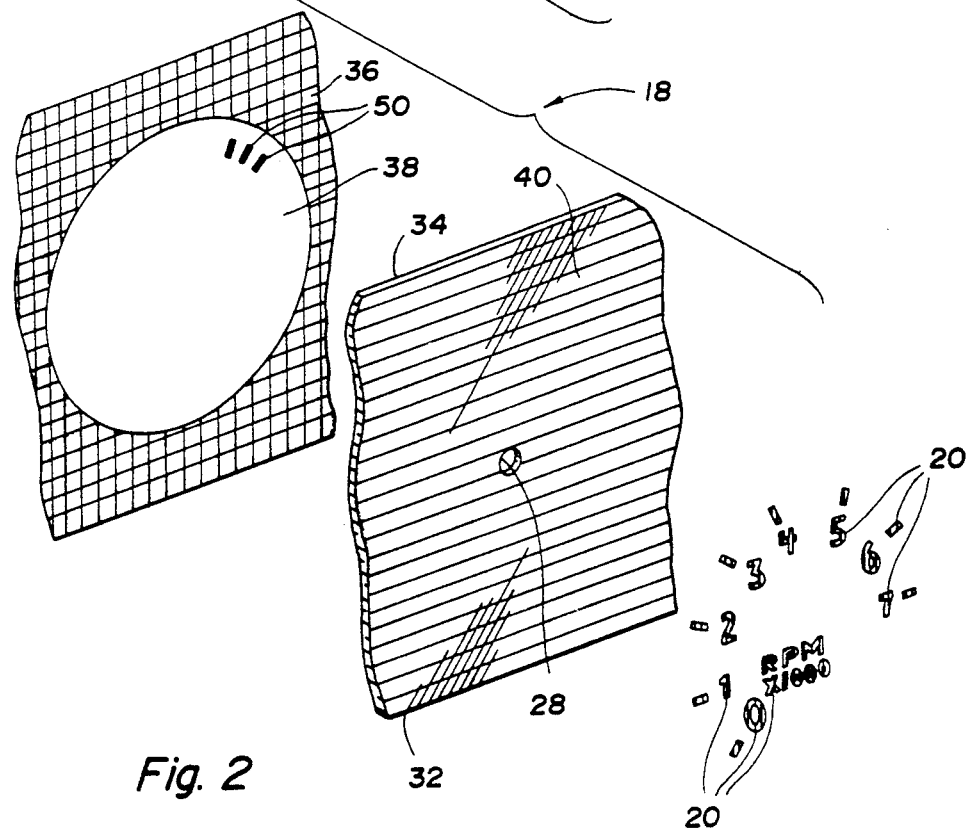
FIG. 2 is a schematic illustration of the applique (image sourcing means) of FIG. 1.

Referring additionally to FIG. 2, it is seen that the applique 18 is a multi-layered film. The base film 32 preferably comprises a translucent or neutral density material, such as 35% transmissivity polycarbonate. The rear face 34 of the base film 32 is coated with an opaque material 36 in the areas which would lie outside the desired active region 16 of light pipe 14, leaving a translucent region 38 that corresponds to and lies in registry with the active region 16 in the assembled image source. The graphic symbols 20 are painted or deposited on the front face 40 of the base film, using a bright opaque material. In the preferred embodiment, a substantially red color material is used to form the graphic symbols 20 in order to achieve high visibility of the projection during high ambient lighting conditions.

Figure 3:
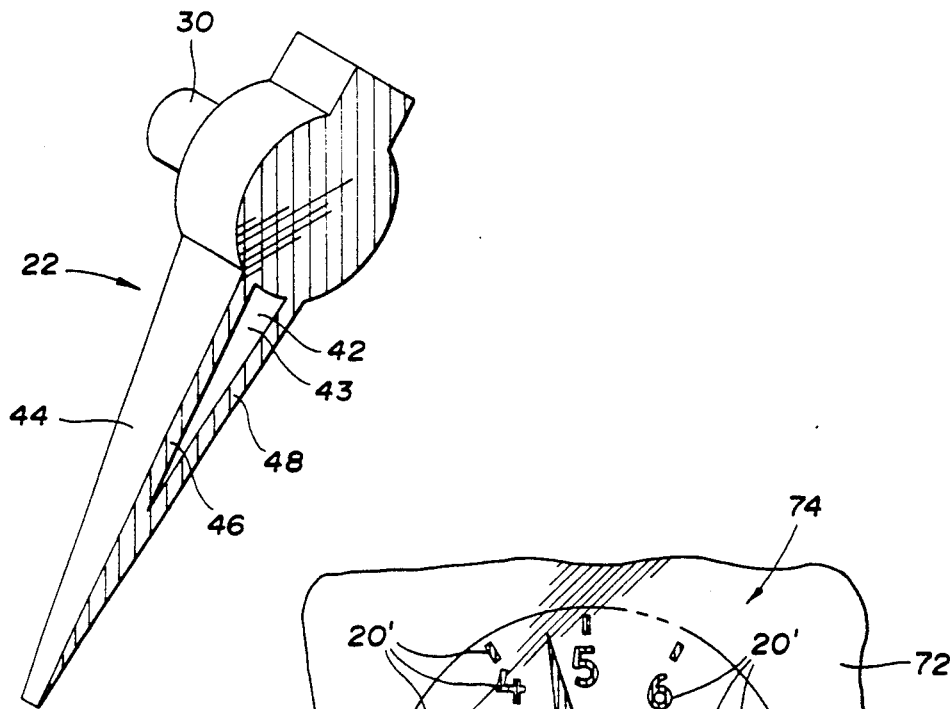
FIG. 3 is an enlarged view of the pointer of FIG. 1.

As seen more clearly in FIG. 3, the pointer 22 is predominantly opaque, with the exception of a generally transparent region 43 along the length of the pointer stem 44. Alternatively, the region 43 may be formed by a physical opening in the stem 44. As with the graphic symbols 20, the opaque area of the pointer 22 is colored brightly to achieve high high visibility in projection during high ambient lighting conditions. In the preferred embodiment, the opaque areas of the pointer 22 are substantially red. To a viewer of the projected display 10, the stem 44 of pointer 22 is thus perceived as a pair of like color stripes 46 and 48 separated by a center contrasting stripe 42.

Figure 4:
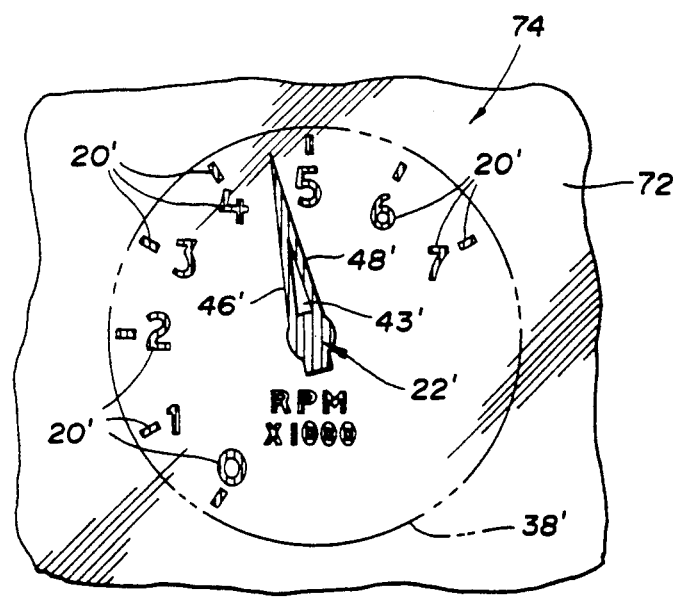
FIGS. 4 and 5 illustrate a portion of the display projection as perceived by a viewer during high and low ambient lighting conditions, respectively.
Figure 5:
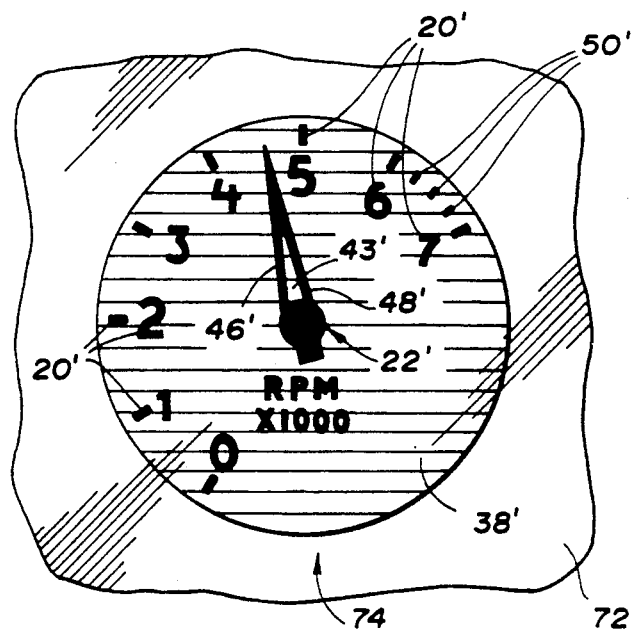

FIGS. 4 and 5 illustrate a viewers perception of the projected display 74 (FIG. 7) in high and low ambient lighting conditions, respectively. It is assumed that the back lighting means, which transmits light through light pipe 14, is unlit in the high ambient lighting conditions of FIG. 4, when the front lighting means that lights the opaque graphics symbols is lit. The back lighting means is lit during the low ambient lighting conditions of FIG. 5, when the front lighting means is not lit.

In the high ambient lighting conditions of FIG. 4, the bright opaque portions of the display 10 dominate in the projection, as perceived by the viewer through windshield 72. In this case, the viewer perceives the projected bright opaque graphic symbols 20' and bright opaque pointer stripes 46' and 48' against the projected relatively dark translucent region 38' of the applique 18, which appears in the projection as transparent. The central pointer stripe defined by the transparent region 43' appears just as transparent as the region 38'.

In the low ambient lighting conditions of FIG. 5, the translucent and transparent portions of the display 10 dominate the perception of the viewer. In this case, the viewer perceives the projected opaque graphic symbols 20' and outer pointer stripes 46' and 48' in silhouette against the relatively bright projected translucent and transparent regions 38' and 43' of applique 18 and projected pointer 22', respectively.

If desired, opaque graphic symbols may also be painted or deposited on the rear face of the base film 32 within the translucent region 38, as indicated by the reference numeral 50 in FIG. 2. Such symbols would not be perceived by a viewer during high ambient conditions when the back lighting means 60 (FIG. 6) is unlit (especially if the symbol color is not highly contrasted with the dark translucent region 38), but would be perceived in silhouette against the region 38 during low ambient conditions when the back lighting means 60 (FIG. 6) is lit as indicated by the minor division graphic marks 50' in FIG. 5.

Additionally, it may be desired to eliminate the transparent region 43 of pointer 22, and instead coat the entire face of the pointer 22 with a bright opaque material. In this case, the the entire pointer 22 would be perceived in silhouette against the bright translucent region 38 when the back lighting means 60 (FIG. 6) is lit during low ambient lighting conditions.

In the transition between low and high ambient lighting conditions, such as at dawn or dusk, the contrast between the graphic symbols 20 and the translucent region 38 is somewhat decreased when the back lighting means 60 (FIG. 6) is lit. The reduced contrast is acceptable, but may be improved by employing a fluorescent opaque material to paint/coat the graphic symbols 20 and pointer 22.

Figure 6:
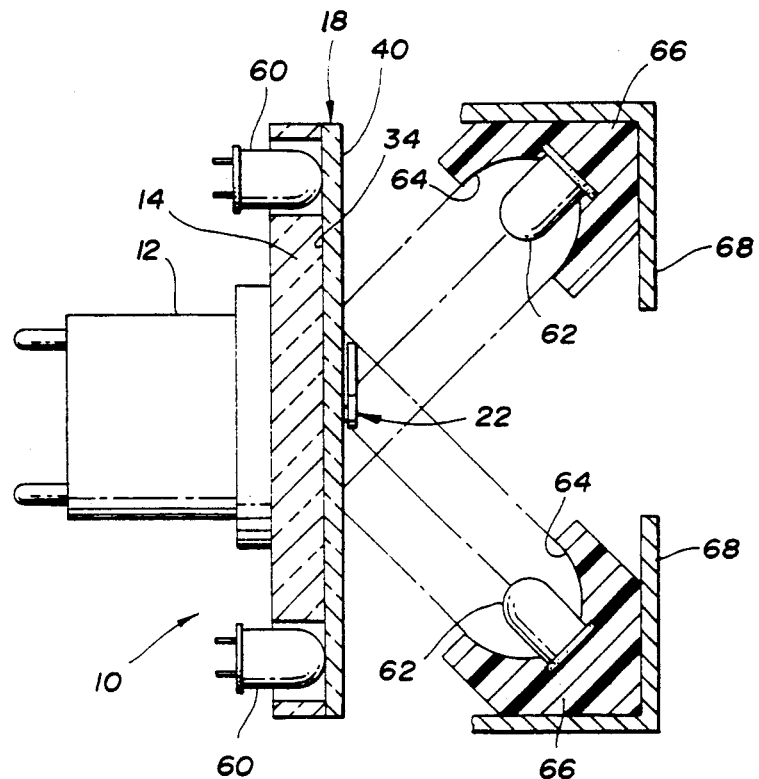
FIG. 6 is a side view of the image source including back and front lighting means.

Referring to FIG. 6, the back lighting means 60 may comprise two incandescent light bulbs as shown. Alternative forms of providing light to the light pipe 14 may be employed. The front lighting means includes light bulbs 62, mounted in the reflectors 66 including parabolic reflecting surfaces 64 for increased lighting efficiency and brightness of the projected display. The baffles 68 prevent unwanted images from being projected in the display.

Figure 7:
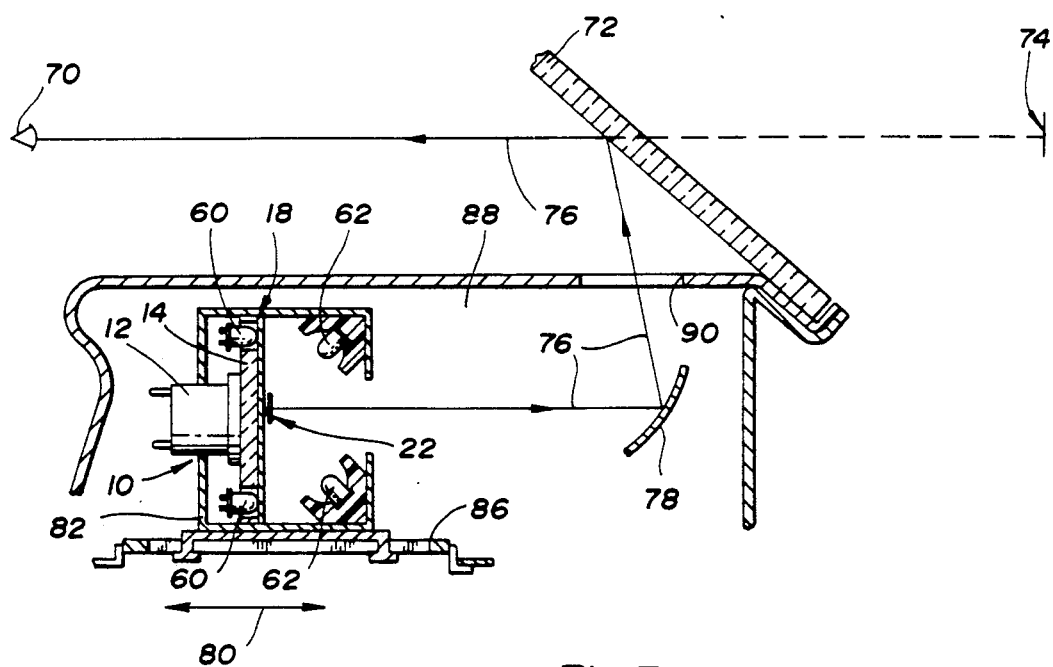
FIG. 7 is a schematic diagram of a vehicle head-up display system incorporating the present invention.

Referring to FIG. 7, the image source 10 is mounted in housing 82 on adjustable mount 86, which may include an adjustable track or other means of adjustment along the direction of arrows 80. The image source is operated as described above and projects an image 74, along image projection path 76, which is reflected off of a curved mirror 78 and the vehicle windshield 72. The image travels to the eye 70 and appears as projected image 74 preferably at least two meters in front of the driver's eye 70.

Typically, vehicle windshields have first and second reflecting surfaces which tend to reflect first and second images of the image source so that the projected image 74 appears as a double image. It has been found, however, that this double image can be eliminated by taking advantage of a natural wedge found in many vehicle windshields due to manufacturer tolerances. By adjusting the image source 10 along the direction of arrows 80, it is possible, in many instances, to converge an otherwise double image into a single projected image 74.

It is preferable that mirror 78 be aspheric to correct for aberrations in projection caused by the aspheric shape of windshield 72. If the windshield 72 is flat or spherical at the point of projection, then the mirror 78 may be spherical. An aspheric mirror that can correct for the aspheric shape of a vehicle windshield is easily designed by one skilled in the art using a ray tracing program such as Code 5 TM, commercially available for licensed use from Optical Research Associates (ORA), Pasadena, Calif.

The adjustable mount 86 may include a slotted base which is movable along a guide in the direction of arrows 80. A locking screw (not shown) is placed in a threaded hole (also not shown) in the slotted base behind the image source and may be tightened against the guide bar to hold the slotted base and image source 10 in place once it is properly adjusted so that the display image appears clear to the vehicle operator.

Possible variations on the adjustable mount 86 may be desired for different implementations of this invention. For example, instead of having a locking screw as described above, the adjustable mount may be connected to an adjustable lever through a cable assembly so that it may be more easily adjustable by the vehicle operator. Alternatively, the adjustable mount may include a small DC motor and a screw gear so that the adjustment of the image source position can be accomplished through a remote switch. The adjustable mounts described above are just example implementations of this invention and may be replaced by any suitable adjustable mount in which image source 10 is adjustable in the direction of arrows 80.

Mirror 78 may be placed on a pivot mechanism (not shown but easily implemented by one skilled in the art) to adjust the height of the display image so it is viewable to vehicle operators with different eye levels by pivoting the mirror 78 along its longitudinal axis.

The entire apparatus comprising the image source 10, adjustable mount 86, and mirror 78 may be placed within the space usually used by vehicle instrumentation, defined in part by reference numeral 88. In such a case, an opening 90 is required to allow the display to be projected off of windshield 72. Alternatively, the entire apparatus may be mounted in a housing above the area normally used for vehicle instrumentation. In short, any area of the vehicle suitable for mounting a head-up display apparatus may be used.

The back and front lighting means may be connected into the vehicle head-light circuit such the front lighting means is activated, and the back lighting means not activated, when the vehicle head-lights are not activated and the vehicle engine is running, indicating high ambient lighting conditions. The apparatus is further connected such that the back lighting means is activated and the front lighting means is not activated when the vehicle head-lights are activated. These circuit connections are easily implemented by one skilled in the art.

While this invention has been described in reference to the illustrated embodiments, it is expected that various modifications will occur to those skilled in the art, and that displays incorporating such modifications may fall within the scope of the present invention, which is defined by the appended claims.

The embodiments of the invention in which an exclusive property or privilege is claimed are defined as follows:

1. Motor vehicle head-up display apparatus adapted to project a display to be viewed by a vehicle occupant during both high and low ambient lighting conditions, comprising:
   means for sourcing an image to be projected;
   means for backlighting the image sourcing means during low ambient lighting conditions, the back lighting means mounted in proximity of a rear surface of the image sourcing means, the rear surface facing opposite a direction of an image projection path; and
   front lighting means for lighting the image source from the front during high lighting conditions, the front lighting means not being lit when the back lighting means is lit and the back lighting means not being lit when the front lighting means is lit;
   the image sourcing means including a film means with a translucent display region and bright opaque graphic symbols forced on a surface of said display region which faces in the direction of the image projection path so that when the front lighting means is illuminating the front of the image source, the occupant perceives a projection of the bright opaque graphic symbols, and so that when the back lighting means is back-lighting the image source the occupant perceives the graphic symbols in silhouette against the lighted translucent display region of said film means.

2. The apparatus set forth in claim 1, wherein the back lighting means includes:
   light piping means for transmitting light; and
   means for providing light to the light piping means.

3. The apparatus set forth in claim 1, further comprising:
   pointer means disposed in proximity to the surface of said translucent display region of said film means facing the direction of the image projection path, the pointer having a brightly colored opaque stem, an image of which is projected and (1) is readily perceived by the occupant when the front lighting means is operated, but (2) is silhouetted against the lighted translucent display region of said film means when the back lighting means is activated.

4. The apparatus set forth in claim 3, wherein:
   the stem of said pointer is defined by a pair of brightly colored opaque regions separated by a generally transparent region, so that the transparent region appears (1) transparent when the front lighting means is activated, and (2) bright when the back lighting means is activated.

5. The apparatus set forth in claim 1, wherein,
   the film means includes opaque graphic symbols formed within said translucent display region on the surface thereof which faces away from the direction of the image projection path, so that such symbols (1) are not perceived by the occupant when the front lighting means is activated, but (2) are perceived in silhouette against the translucent display region when the back lighting means is activated.

6. The apparatus set forth in claim 1 wherein the opaque graphic symbols are substantially red in color.

7. The apparatus set forth in claim 3 wherein the opaque region of the pointer is substantially red in color.

8. The apparatus set forth in claim 1 wherein the back lighting means is primarily activated during low ambient lighting conditions and the front lighting means is primarily activated during high ambient lighting conditions.

9. The apparatus set forth in claim 1 wherein the motor vehicle has a state of ignition on and includes headlights operated by a switch to be on or off and wherein (1) the back lighting means is activated when the vehicle is in a state of ignition on and the headlights are on and (2) the front lighting means is activated when the vehicle is in a state of ignition on and the headlights are off.

* * * * *